United States Patent
Conti et al.

(10) Patent No.: US 12,213,325 B2
(45) Date of Patent: Jan. 28, 2025

(54) TECHNIQUES FOR MANUFACTURING A DOUBLE ELECTRODE MEMORY ARRAY

(71) Applicant: Micron Technology, Inc., Boise, ID (US)

(72) Inventors: Anna Maria Conti, Milan (IT); Andrea Gotti, Boise, ID (US); Pavan Reddy K. Aella, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 570 days.

(21) Appl. No.: 17/499,709

(22) Filed: Oct. 12, 2021

(65) Prior Publication Data

US 2023/0113960 A1    Apr. 13, 2023

(51) Int. Cl.
*H10B 63/00* (2023.01)
*H10N 70/00* (2023.01)
*H10N 70/20* (2023.01)

(52) U.S. Cl.
CPC ........... *H10B 63/84* (2023.02); *H10N 70/021* (2023.02); *H10N 70/231* (2023.02); *H10N 70/826* (2023.02)

(58) Field of Classification Search
CPC ... H10N 70/021; H10N 70/231; H10N 70/826
See application file for complete search history.

(56) References Cited

U.S. PATENT DOCUMENTS

| | | | |
|---|---|---|---|
| 11,201,168 B2 * | 12/2021 | Ku | H10B 43/50 |
| 2012/0012897 A1 * | 1/2012 | Besser | H10N 70/24 |
| | | | 257/E23.141 |
| 2022/0045200 A1 * | 2/2022 | Sandow | H01L 29/7803 |

FOREIGN PATENT DOCUMENTS

CN    103296069 B  *  3/2016  ......... H01L 21/3065

* cited by examiner

*Primary Examiner* — Marvin Payen
(74) *Attorney, Agent, or Firm* — Holland & Hart LLP

(57) ABSTRACT

Methods, systems, and devices for techniques for manufacturing a double electrode memory array are described. A memory device may be fabricated using a sequence of fabrication steps that include depositing a first stack of materials including a conductive layer, an interface layer, and a first electrode layer. The first stack of materials may be etched to form a first set of trenches. A second stack of materials may be deposited on top of the first stack of materials. The second stack may include a second electrode layer in contact with the first electrode layer, a storage layer, and a third electrode layer. The second stack of materials may be etched to form a second set of trenches above the first set of trenches, and filled with a sealing layer and a dielectric material. The sealing layer may not extend substantially into the first set of trenches.

25 Claims, 7 Drawing Sheets

TECHNIQUES FOR MANUFACTURING A DOUBLE ELECTRODE MEMORY ARRAY

FIELD OF TECHNOLOGY

The following relates generally to one or more systems for memory and more specifically to techniques for manufacturing a double electrode memory array.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
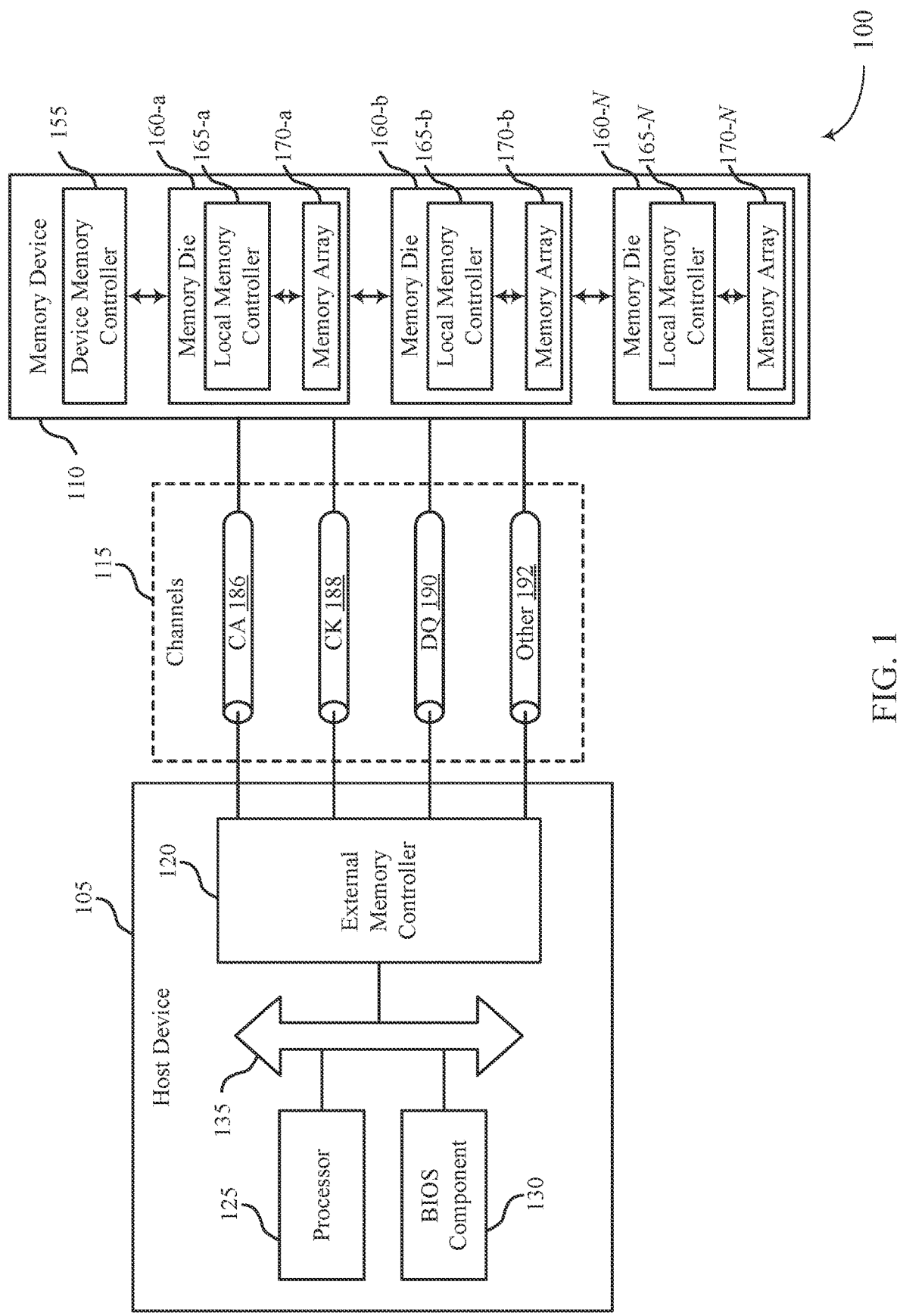
FIG. 1 illustrates an example of a system that supports techniques for manufacturing a double electrode memory array in accordance with examples as disclosed herein.

Manufacturing approaches used to form memory arrays may include process flows which introduce an architectural difference between a first deck of memory cells and upper decks of memory cells. For example, in cross-point type memories, etch and dielectric fill steps may be performed in one or two steps (e.g., a "split" flow may be used). The split flow may use two steps and may allow for better control of a thickness or additional material options for a sealing layer between the stack of materials and the dielectric fill material. For example, the split flow may allow for thicknesses dedicated for each of different sections of layers of the stack of materials, material with enhanced properties for each of the different sections, or both. The split flow may allow for a relatively thick sealing layer, which may result in a relatively flatter interface layer (e.g., a tungsten silicon nitride (WSiN) layer) between the word lines and electrode layers. However, a thick sealing layer may also result in a high capacitance between word lines, for example if a dielectric constant of the sealing material is higher than a dielectric constant of the filling material. Techniques are desired for reducing capacitance between word lines while achieving a flat interface layer.

Processes for forming memory cells may include forming a first stack of materials that includes a conductive layer, an interface layer, and a first electrode layer. A masking pattern may be used to remove material from the first stack to form a set of trenches in the first stack of materials. The first set of trenches may define word lines using the etched conductive layer. A sealing layer may be formed on the surface of the set of trenches left by removing material from the first stack, and a filling material may fill the remaining void of the trenches. A planarization procedure (e.g., a chemical mechanical polishing (CMP) procedure) may be used to planarize the first stack, exposing the first electrode layer.

Subsequently, a second electrode layer may be deposited on the first stack of materials, followed by a storage layer and a third electrode layer. A second etching procedure may etch a second set of trenches in the second stack of materials, stopping after etching through the second electrode layer. After the second etching has been performed, a second sealing layer may be deposited in the second set of trenches. Because the second etching was stopped after the etching the second electrode layer, the second sealing layer may not extend between the conductive layer of the first stack (e.g., between the word lines defined in the first stack). This may mitigate the capacitance between access lines by reducing the amount of sealing material between adjacent access lines.

Features of the disclosure are initially described in the context of memory systems, dies, and arrays as described with reference to FIGS. 1-3. Features of the disclosure are described in the context of cross-sections of a memory device as described with reference to FIGS. 4-5. These and other features of the disclosure are further illustrated by and described with reference to an apparatus diagram and flowcharts that relate to techniques for manufacturing a double electrode memory array as described with references to FIGS. 6-7.

FIG. 1 illustrates an example of a system 100 that supports techniques for manufacturing a double electrode memory array in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

As described herein, a memory die 160 may include more than one memory arrays 170. In some examples, each memory cell or deck of a memory array 170 may include a bottom electrode layer, a storage layer, and a top electrode layer. In some cases, the bottom electrode layer of a deck may be deposited in two steps. For example, a first stack of materials may be deposited that includes a conductive layer, (e.g., an access line), an interface layer, and a first electrode layer (e.g., a portion of the bottom electrode layer). The first stack of materials may be etched to form a first set of trenches and filled with a sealing layer and a dielectric material.

In some examples, a second stack of materials may be deposited on the first stack of materials. The second stack of materials may include a second electrode layer (e.g., the remaining portion of the bottom electrode layer), a storage layer, and a third electrode layer (e.g., the top electrode). The second stack of materials may be etched to form a second set of trenches above the first set of trenches. In some example, the second set of trenches may terminate above the first set of trenches. The second set of trenches may be filled with a second sealing layer and a dielectric material. The second sealing layer may not extend substantially between the conductive layer of the first stack of materials. It should be noted that, although FIG. 1 describes using a chalcogenide material for storage, the techniques described herein may be applicable to any memory type that uses a self-selecting memory material or cross-point type architecture.

Figure 2:
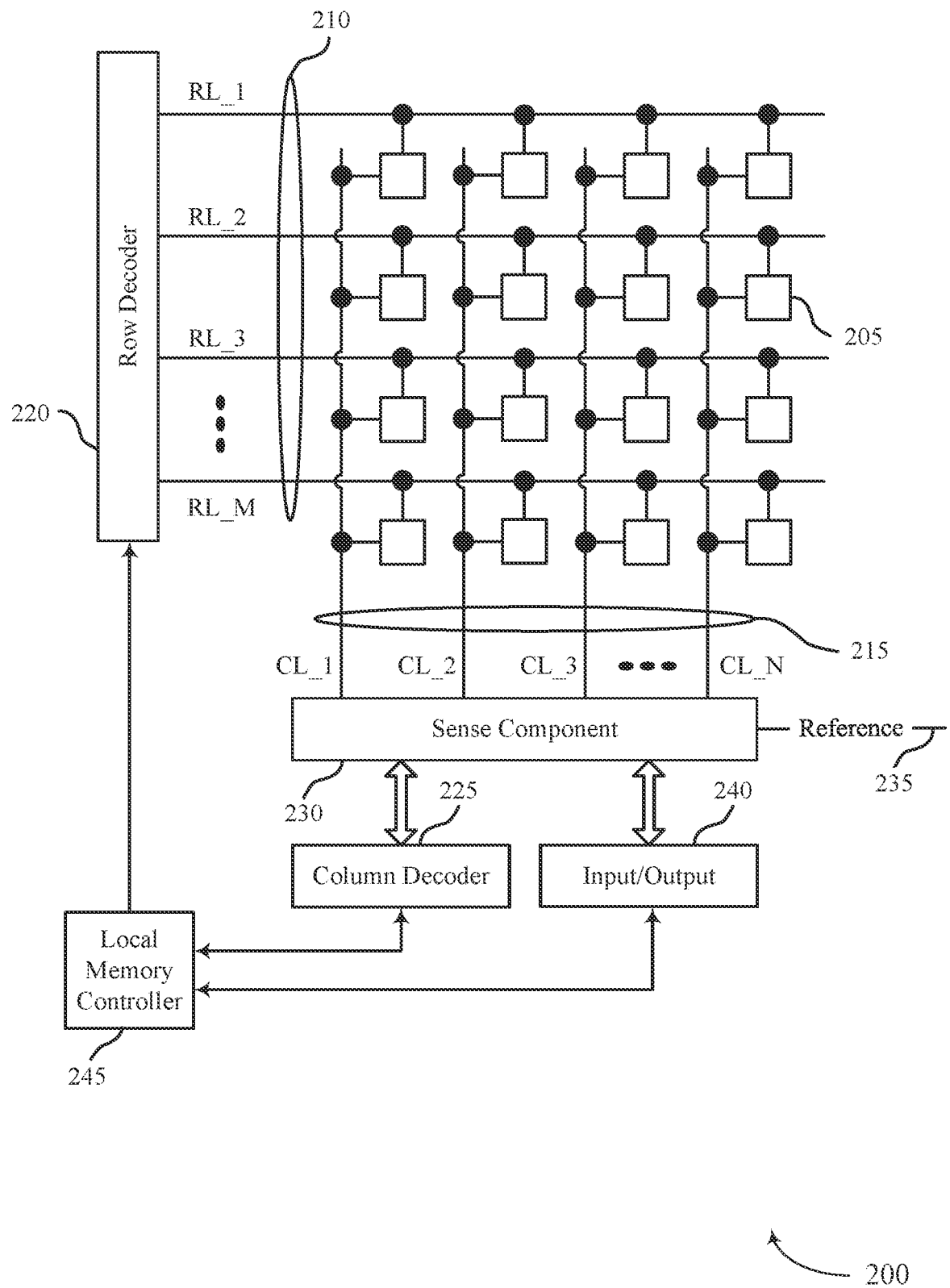
FIG. 2 illustrates an example of a memory die that supports techniques for manufacturing a double electrode memory array in accordance with examples as disclosed herein.

FIG. 2 illustrates an example of a memory die 200 that supports techniques for manufacturing a double electrode memory array in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

As described herein, a memory die 200 may include more than one memory arrays. In some examples, each memory cell 205 of a memory array may include a bottom electrode layer, a storage layer, and a top electrode layer. In some cases, the bottom electrode layer of a deck may be deposited in two steps. For example, a first stack of materials may be deposited that includes a conductive layer, (e.g., an access line, such as row line 210 or column line 215), an interface layer, and a first electrode layer (e.g., a portion of the bottom electrode layer). The first stack of materials may be etched to form a first set of trenches and filled with a sealing layer and a dielectric material.

In some examples, a second stack of materials may be deposited on the first stack of materials. The second stack of materials may include a second electrode layer (e.g., the remaining portion of the bottom electrode layer), a storage layer, and a third electrode layer (e.g., the top electrode). The second stack of materials may be etched to form a second set of trenches above the first set of trenches. In some example, the second set of trenches may terminate above the first set of trenches. The second set of trenches may be filled with a second sealing layer and a dielectric material. The second sealing layer may not extend substantially between the conductive layer of the first stack of materials. It should be noted that, although FIG. 2 describes using a chalcogenide material for storage, the techniques described herein may be applicable to any memory type that uses a self-selecting memory material or cross-point type architecture.

Figure 3:
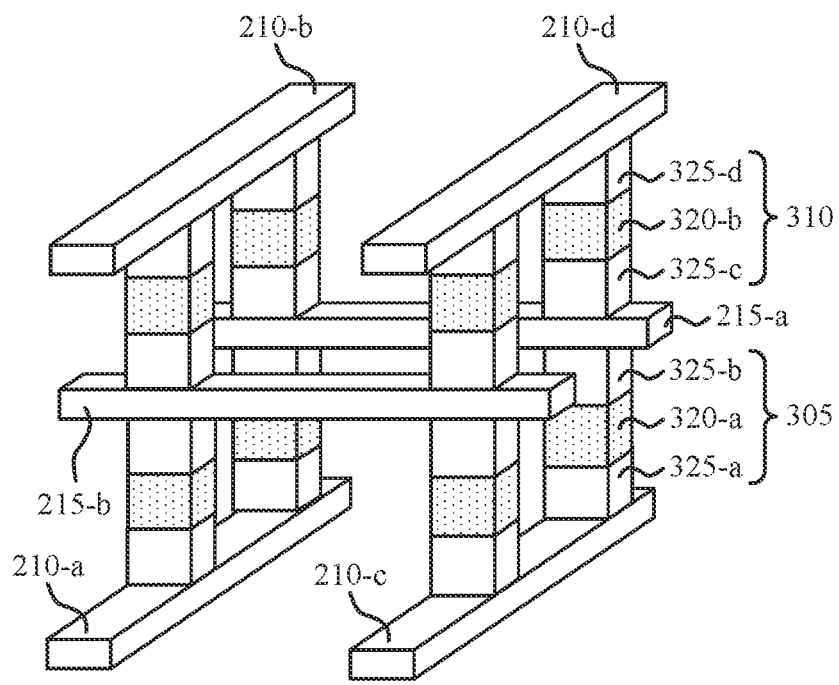
FIG. 3 illustrates an example of memory cells that support techniques for manufacturing a double electrode memory array in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-a, storage element 320-a, electrode 325-b), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

As described herein, a memory array 300 may include more than one memory deck. In some examples, each deck of the memory array 300 may include a bottom electrode layer (e.g., bottom electrode 325-a), a storage layer (e.g., storage element 320-a), and a top electrode layer (e.g., top electrode 325-b). In some cases, the bottom electrode layer of a deck may be deposited in two steps. For example, a first stack of materials may be deposited that includes a conductive layer, (e.g., an access line, such as row line 210 or column line 215), an interface layer, and a first electrode layer (e.g., a portion of the bottom electrode layer). The first stack of materials may be etched to form a first set of trenches and filled with a sealing layer and a dielectric material.

In some examples, a second stack of materials may be deposited on the first stack of materials. The second stack of materials may include a second electrode layer (e.g., the remaining portion of the bottom electrode layer), a storage layer, and a third electrode layer (e.g., the top electrode). The second stack of materials may be etched to form a second set of trenches above the first set of trenches. In some example, the second set of trenches may terminate above the first set of trenches. The second set of trenches may be filled with a second sealing layer and a dielectric material. The second sealing layer may not extend substantially between the conductive layer of the first stack of materials. It should be noted that, although FIG. 3 describes using a chalcogenide material for storage, the techniques described herein may be applicable to any memory type that uses a self-selecting memory material or cross-point type architecture.

Figure 4A:
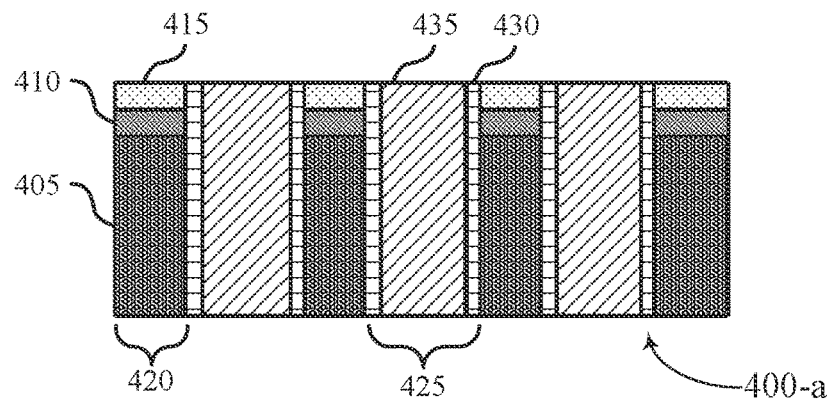
FIGS. 4A through 4C illustrate examples of cross sections of stacks of materials that support techniques for manufacturing a double electrode memory array in accordance with examples as disclosed herein.
Figure 4B:
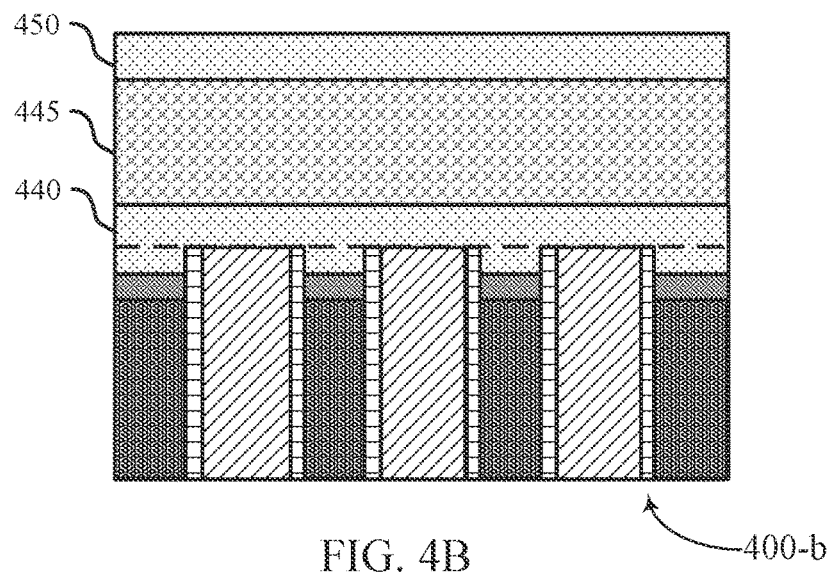
Figure 4C:
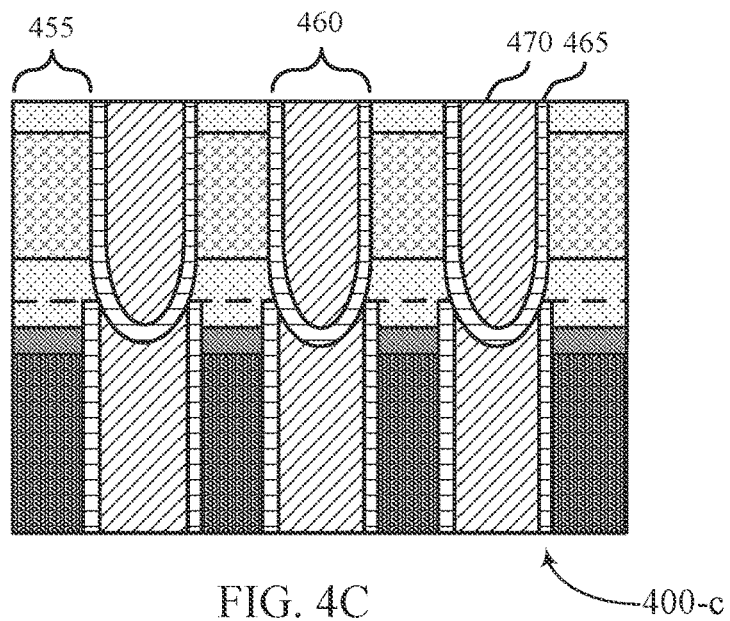

FIGS. 4A, 4B, and 4C illustrate examples of cross sections of stacks of materials 400-a, 400-b, and 400-c that support techniques for manufacturing a double electrode memory array in accordance with examples as disclosed herein.

FIG. 4A illustrates a first stack of materials 400-a. In some cases, the first stack of materials may include a conductive layer 405, an interface layer 410, and an electrode layer 415 (e.g., first electrode layer). The first stack of materials may also include one or more sections 420 and one or more trenches 425. In some cases, a sealing layer 430 may be in contact with one or more sidewalls of the trenches 425, one or more sidewalls of the sections 420, or both. Additionally, the trenches 425 may be filled with a dielectric material (e.g., a filling layer, a dielectric layer).

In some examples, the first stack of materials 400-a may be formed by first forming, for example by depositing, the conductive layer 405. The conductive layer 405 may be an example of a conducting metal, such as tungsten. Subsequently, the interface layer 410 may be deposited on the conductive layer 405, followed by depositing the electrode layer 415 on the interface layer 410. In some examples, the electrode layer 415 may include a material such as carbon. In some cases, the interface layer 410 may act as a barrier or "glue" between the conductive layer 405 and the electrode layer 415, and may include a material such as tungsten silicon nitride.

The sections 420 and the trenches 425 of the first stack of materials 400-a may be formed by removing material from the first stack of materials 400-a (e.g., using an etching process). For example, a patterned mask may be used to perform a first etching of the first stack of materials 400-a along a first direction. The first etching may be used to remove material from the electrode layer 415, the interface layer 410, and the conductive layer 405 (e.g., by "cutting" the layers of the first stack of materials 400-a). The removed material may form voids (e.g., the trenches 425) between the resulting sections 420. The first etching may define access lines for a memory array. That is, the conductive layer 405 of each the sections 420 may be configured as an access line, such as a word line. In some examples, there may be a first capacitance between the conductive layer 405 of each the sections 420 (e.g., between each of the access lines) that may depend at least in part on dielectric constants of the sealing layer 430 and the dielectric layer 435.

In some examples, the sealing layer 430 may be formed on the first stack of materials 400-a after performing the first etching. The sealing layer 430 may be deposited to contact the sidewalls of the sections 420. Subsequently, the trenches 425 may be filled with the dielectric layer 435, such that the dielectric layer 435 may be separated from the sections 420 by the sealing layer 430. The dielectric layer 435 may be configured to provide structure while limiting an amount of charge that may be transferred between the sections 420. In some cases, the dielectric layer may be or include an oxide of silicon (e.g., SiO2) or a nitride of silicon (e.g., Si3N4), among other oxides, nitrides, or other dielectric materials.

In some cases, the sealing layer 430 may have a dielectric constant that is greater than the dielectric constant of the dielectric layer 435. For example, the sealing layer 430 may include materials such as jade or a nitride-like material, which may have a higher dielectric constant than the dielectric material used for the dielectric layer 435.

After forming the dielectric layer 435, the first stack of materials may undergo a first planarization step, for example by using a chemical mechanical planarization (CMP) procedure. The planarization may flatten the first stack of materials, for example by removing material added during the forming of the dielectric layer 435 and at least a portion of the material of the electrode layer 415. Forming the dielectric layer 435 may result in a bumpy surface, which may be smoothed (e.g., flattened) during the first planarization step. In some examples, the first planarization step may not remove a portion of the interface layer 410 (e.g., the planarization may stop prior to reaching the interface layer 410). That is, the electrode layer 415 may act as a barrier to protect the interface layer 410 from being exposed to the first planarization step. Thus, the techniques described herein may allow the interface layer 410 to be deposited before the first etching step described above, while reducing damage to the interface layer 410 resulting from the first planarization step.

FIG. 4B illustrates a stack of materials 400-b that includes a second stack of materials formed on top of the first stack of materials 400-a. The second stack of materials may include a second electrode layer 440, a storage layer 445, and a third electrode layer 450. The second stack of materials 400-b may be formed by depositing a second electrode layer 440 on the first stack of materials 400-a. The second electrode layer may include the same material (e.g., carbon) as the electrode layer 415 and be in direct contact with the electrode layer 415. That is, the first electrode layer 415 and the second electrode layer 440 may be part of the same electrode, but deposited in a two-step process (e.g., the first electrode layer 415 may be deposited prior to etching the interface layer 410, while the second electrode layer may 440 be deposited after etching the interface layer 410). The two-step process for depositing the first and second electrode layers 415 and 440 may result in a relatively flatter interface layer 410.

Subsequently, the storage layer 445 may be deposited. The storage layer 445 may include a storage or memory material, such as a chalcogenide material. In some examples, the memory material may be configured as a self-selecting material. That is, the memory material may be configured to act as both a selector component and a storage component. The storage layer 445 may be deposited to be in contact with the second electrode layer 440 (e.g., the storage layer 445 may be directly on top of the second electrode layer 440).

After depositing the storage layer 445, the third electrode layer 450 may be deposited. The third electrode layer 450 may include the same material (e.g., carbon) as the first electrode layer 415 and the second electrode layer 440, while not being in contact with either the first electrode layer 415 or the second electrode layer 440. For example, the third electrode layer 450 may be deposited on top of the storage layer 445, so that the storage layer 445 lies between the second electrode layer 440 and the third electrode layer 450.

FIG. 4C illustrates a stack of materials 400-c that includes the stack of materials 400-b after undergoing an etching, sealing, and filling procedure. The stack of materials 400-c may additionally include a second set of sections 455, where each of the sections 455 include the second electrode layer 440, the storage layer 445, and the third electrode layer 450. The second set of sections 455 may be positioned over the first set of sections 420. Additionally, the stack of materials 400-c may include a second set of trenches 460, where each of the trenches 460 are lined with a second sealing layer 465 and filled a second dielectric layer 470.

The stack of materials 400-c may be manufactured from the stack of materials 400-b by applying a second etching procedure. For example, the sections 455 and the trenches 460 of the stack of materials 400-c may be formed by removing material from the stack of materials 400-b (e.g., using an etching process). In some cases, a patterned mask different than the patterned mask used to perform the first etching procedure (e.g., different than the patterned mask used to produce the trenches 425) may be used to perform the second etching of the stack of materials 400-b. The second etching may be used to remove material from the third electrode layer 450, the storage layer 445, and the second electrode layer 440 (e.g., by "cutting" the layers of the second stack of materials 400-b. The removed material may form voids (e.g., the trenches 460) between the resulting sections 455.

In some examples, the second etching may stop (e.g., terminate) prior to reaching the interface layer 410. That is, the sidewalls of the resulting trenches 460 may terminate above the interface layer 410, so that the trenches 460 do not extend to be between the conductive layer 405 of the sections 420. For example, the sidewalls may extend to a threshold percentage (e.g., 5%, 10%) of the height of the conductive layer 405. In some cases, such a configuration of the trenches 460 may result in an "undercut" between the first electrode layer 415 and the second electrode layer 440. Said another way, the second electrode layer 440 of the second sections 455 may extend further in a lateral dimension than the first electrode layer 415 at the interface with the first electrode layer 415, as illustrated in FIG. 4C.

After performing the second etching procedure, the second sealing layer 465 may be formed on the stack of materials 400-c. The second sealing layer 465 may be deposited to contact the sidewalls of the sections 455. Subsequently, the trenches 460 may be filled with the second dielectric layer 470, such that the second dielectric layer 470 may be separated from the sections 455 by the second sealing layer 465. The dielectric layer 470 may be configured to provide structure while limiting an amount of charge that may be transferred between the sections 455.

In some cases, the second sealing layer 465 may be thicker than the sealing layer 430. Additionally or alternatively, the second sealing layer 465 may have a dielectric constant that is greater than the dielectric constant of the second dielectric layer 470. Additionally, because the trenches 460 may not extend to be between the conductive layer 405 of the sections 420, the second sealing layer 465 may also not extend to be between the conductive layer 405 of the sections 420. Thus, the resulting capacitance between the conductive layer 405 of the sections 420 may be reduced compared to a configuration in which more sealing material lies between the conductive layer 405 of the sections 420. That is, because the sealing material may have a higher dielectric constant than the dielectric filling material, reducing the amount of sealing material between conductive sections may reduce the capacitance between the conductive sections.

After forming the second dielectric layer 470, the stack of materials 400-c may undergo a second planarization step, for example by using a CMP procedure. The planarization may flatten the stack of materials 400-c, for example by removing material added during the forming of the sealing layer 465 and dielectric layer 470, and at least a portion of the material of the third electrode layer 450. Forming the dielectric layer 470 may result in a bumpy surface, which may be smoothed (e.g., flattened) during the second planarization step. In some cases, the planarization may expose the third electrode layer 450.

The resulting stack of materials 400-c may be configured as a deck of a memory array, where the conductive layer 405 of the sections 420 forms access lines, such as word lines. The storage layer 445 of the sections 455 may form a storage component of a memory cell, with the third electrode layer 450 forming a top electrode for accessing the memory cell, and the first and second electrode layers 415 and 440 collectively form a bottom electrode of the memory cell.

Figure 5:
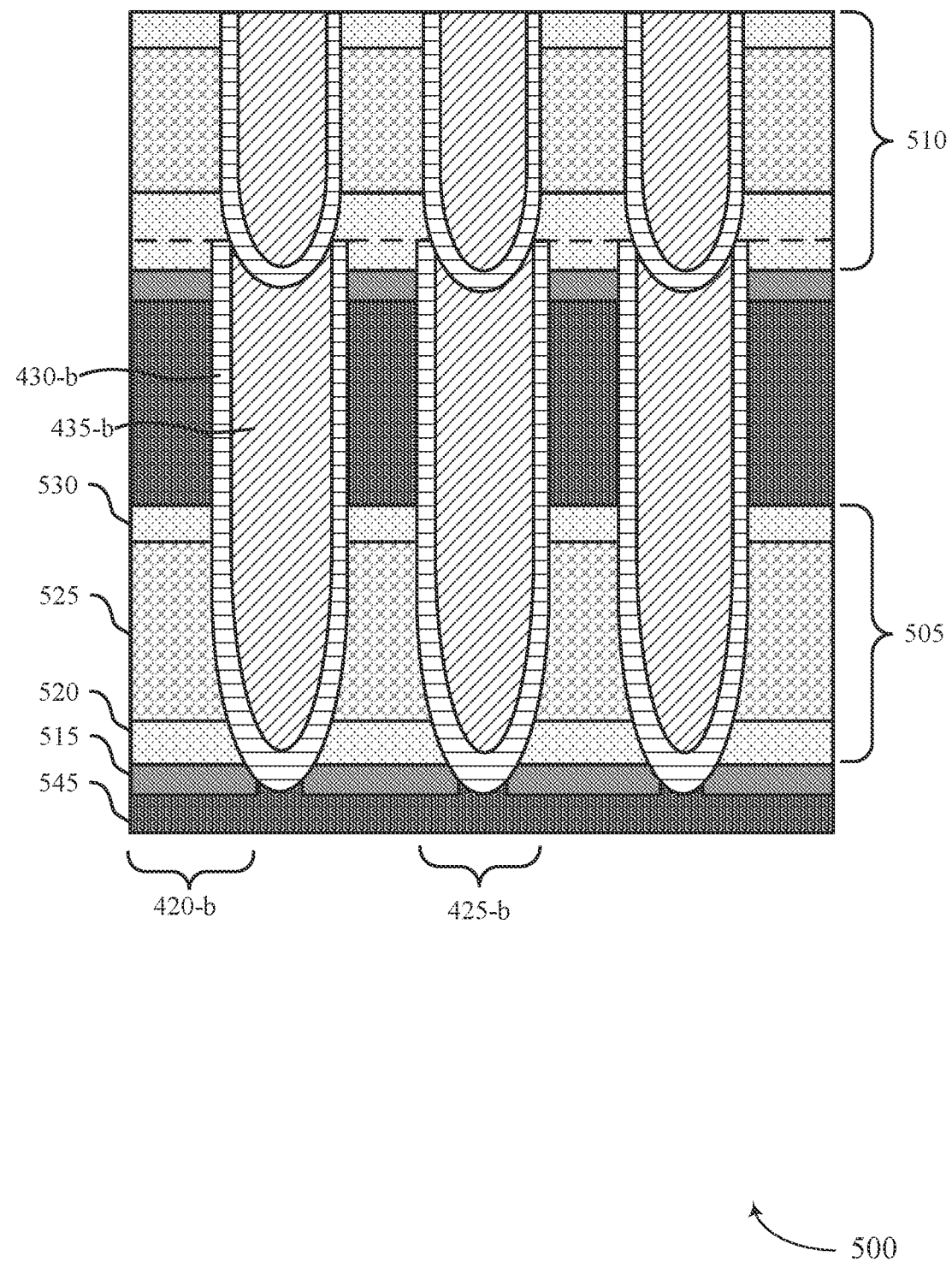
FIG. 5 illustrates an example of a cross-sectional view of a stack of materials that supports techniques for manufacturing a double electrode memory array in accordance with examples as disclosed herein.

FIG. 5 illustrates an example of a stack of materials 500 that supports techniques for manufacturing a double electrode memory array in accordance with examples as disclosed herein. The stack of materials 500 may include a first deck 505 and a second deck 510.

The first deck 505 may be arranged on top of a conductive layer 545 and an interface layer 515. The first deck 505 may include a bottom electrode layer 520, a storage layer 525, and a top electrode layer 530. In some cases, the first deck 505, the conductive layer 545, and the interface layer 515 may be an example of a third stack of materials arranged below the first stack of materials 405-a described with reference to FIG. 4A. In some examples, the first stack of materials 405-a may include the second deck 510.

In some examples, prior to depositing the conductive layer 405 of the first stack of materials 400-a, the interface layer 515 may be deposited on the conductive layer 545.

Subsequently, the bottom electrode layer 415 may be deposited on the interface layer 515, followed by depositing the storage layer 525 on the bottom electrode layer 520, followed by depositing the top electrode layer 530 on the storage layer 525. In some examples, the electrode layers 530 and 520 may include a material such as carbon. In some cases, the interface layer 515 may include a material such as tungsten silicon nitride. The first stack of materials 400-*a* may then be deposited. In some cases, the conductive layer 405 may be deposited to be in contact with (e.g., on top of) the top electrode layer 530. In some examples, the conductive layer 405 may be configured as a first access line (e.g., a word line), while the conductive layer 545 may be configured as a second access line orthogonal to the first access line (e.g., a bit line).

In some cases, the first etching procedure used to etch the trenches 425 and form the sections 420, as described with reference to FIG. 4A, may be extended to etch one or more trenches 425-*b* and form one or more sections 420-*b* That is, the first etching procedure may use the first patterned mask to etch beyond the conductive layer 405, through the top electrode layer 530, the storage layer 525, the bottom electrode layer 520, and the interface layer 515, stopping without etching the conductive layer 545. The resulting trenches 425-*b* may separate the resulting sections 420-*b*.

After performing the first etching procedure, a sealing layer 430-*b* may be formed on the first deck 505. The sealing layer 430-*b* may be deposited to contact the sidewalls of the sections 420-*b*. Subsequently, the trenches 425-*b* may be filled with a dielectric layer 435-*b*, such that the dielectric layer 435-*b* may be separated from the sections 420-*b* by the sealing layer 430-*b*. The dielectric layer 435-*b* may be configured to provide structure while limiting an amount of charge that may be transferred between the sections 420-*b*. In some cases, the sealing layer 430-*b* and the dielectric layer 435-*b* may be extensions of the sealing layer 430 and the dielectric layer 435, respectively, as described with reference to FIG. 4A.

In some cases, the second deck 510 may be included in at least a portion of the stack of materials 400-*c* described with reference to FIG. 4C. For example, the second deck 510 may include a set of sections, each section including a bottom electrode layer in contact with the interface layer, a storage layer in contact with the bottom electrode layer, and a top electrode layer in contact with the storage layer. The second deck 510 may be formed over a conductive layer configured as an access line, an interface layer in contact with the conductive layer, a bottom electrode layer in contact with the interface layer, a storage layer in contact with the bottom electrode layer, and a top electrode layer in contact with the storage layer. The second deck 510 may be formed (e.g., as described with reference to FIGS. 4B and 4C) above the first deck 505. In some cases, a sealing layer of the second deck 510 (e.g.,) may not extend substantially between the conductive layer 405 (e.g., between the word lines) of the first stack of materials 400-*a*.

Figure 6:
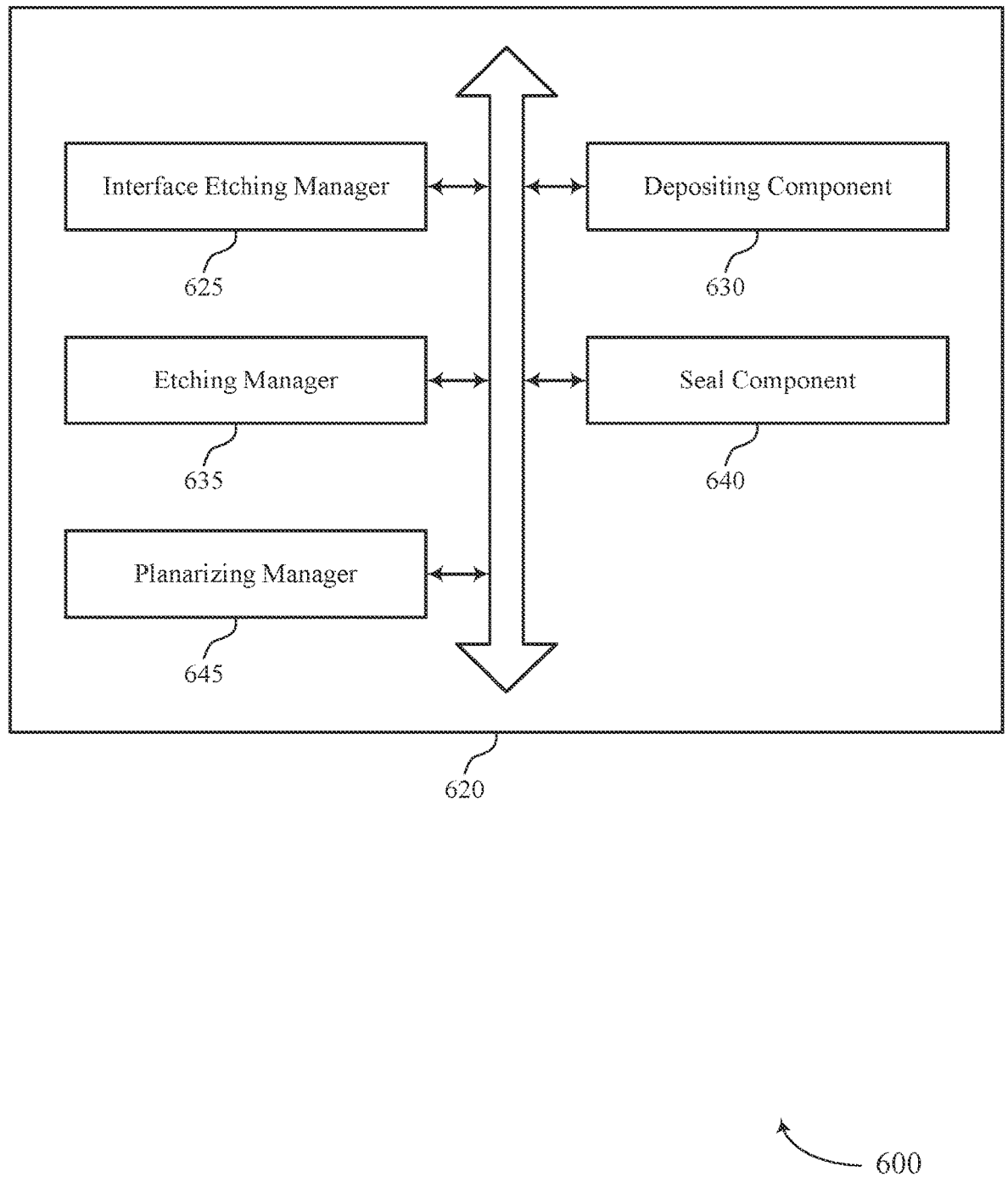
FIG. 6 shows a block diagram of a process controller that supports techniques for manufacturing a double electrode memory array in accordance with examples as disclosed herein.

FIG. 6 shows a block diagram 600 of a process controller 620 that supports techniques for manufacturing a double electrode memory array in accordance with examples as disclosed herein. The process controller 620 may be an example of aspects of a process controller as described with reference to FIGS. 1 through 5. The process controller 620, or various components thereof, may be an example of means for performing various aspects of techniques for manufacturing a double electrode memory array as described herein. For example, the process controller 620 may include an interface etching manager 625, a depositing component 630, an etching manager 635, a seal component 640, a planarizing manager 645, or any combination thereof. Each of these components may communicate, directly or indirectly, with one another (e.g., via one or more buses).

The interface etching manager 625 may be configured as or otherwise support a means for etching a first plurality of trenches along a first direction into a first stack of materials to create a first plurality of sections of the first stack of materials, the first stack of materials including a first conductive layer, a first interface layer, and a first electrode layer. The depositing component 630 may be configured as or otherwise support a means for depositing, over the first plurality of sections, a second stack of materials, the second stack of materials including a second electrode layer in contact with the first electrode layer in the first plurality of sections, a storage layer, and a third electrode layer. The etching manager 635 may be configured as or otherwise support a means for etching a second plurality of trenches along the first direction into the second stack of materials to create a second plurality of sections of the second stack of materials, sidewalls of each of the second plurality of trenches terminating above the first interface layer. The seal component 640 may be configured as or otherwise support a means for depositing a sealing layer in each of the second plurality of trenches, the sealing layer contacting a first side wall, a second side wall, and the bottom of each of the second plurality of trenches.

In some examples, the depositing component 630 may be configured as or otherwise support a means for depositing the first stack of materials, where etching the first plurality of trenches is based at least in part on depositing the first stack of materials.

In some examples, the depositing component 630 may be configured as or otherwise support a means for depositing a third stack of materials, the third stack of materials including a fourth electrode layer, a second storage layer, a fifth electrode layer, and a second interface layer, where depositing the first stack of materials is based at least in part on depositing the third stack of materials.

In some examples, the seal component 640 may be configured as or otherwise support a means for depositing, on the first stack of materials, a second sealing layer and a first dielectric layer, the first dielectric layer filling the first plurality of trenches.

In some examples, a dielectric constant of the sealing layer is greater than a dielectric constant of the first dielectric layer.

In some examples, a thickness of the second sealing layer is different than a thickness of the first sealing layer.

In some examples, the planarizing manager 645 may be configured as or otherwise support a means for planarizing the first stack of materials, where the planarizing includes removing at least a portion of the first electrode layer.

In some examples, the depositing component 630 may be configured as or otherwise support a means for depositing, on the second plurality of sections, a second dielectric layer, the second dielectric layer in contact with the sealing layer and filling the second plurality of trenches.

In some examples, the planarizing manager 645 may be configured as or otherwise support a means for planarizing the second plurality of sections, where the planarizing includes planarizing at least a portion of the third electrode layer.

In some examples, the first interface layer includes tungsten silicon nitride.

In some examples, the first conductive layer includes tungsten.

In some examples, the storage layer includes a chalcogenide material.

Figure 7:
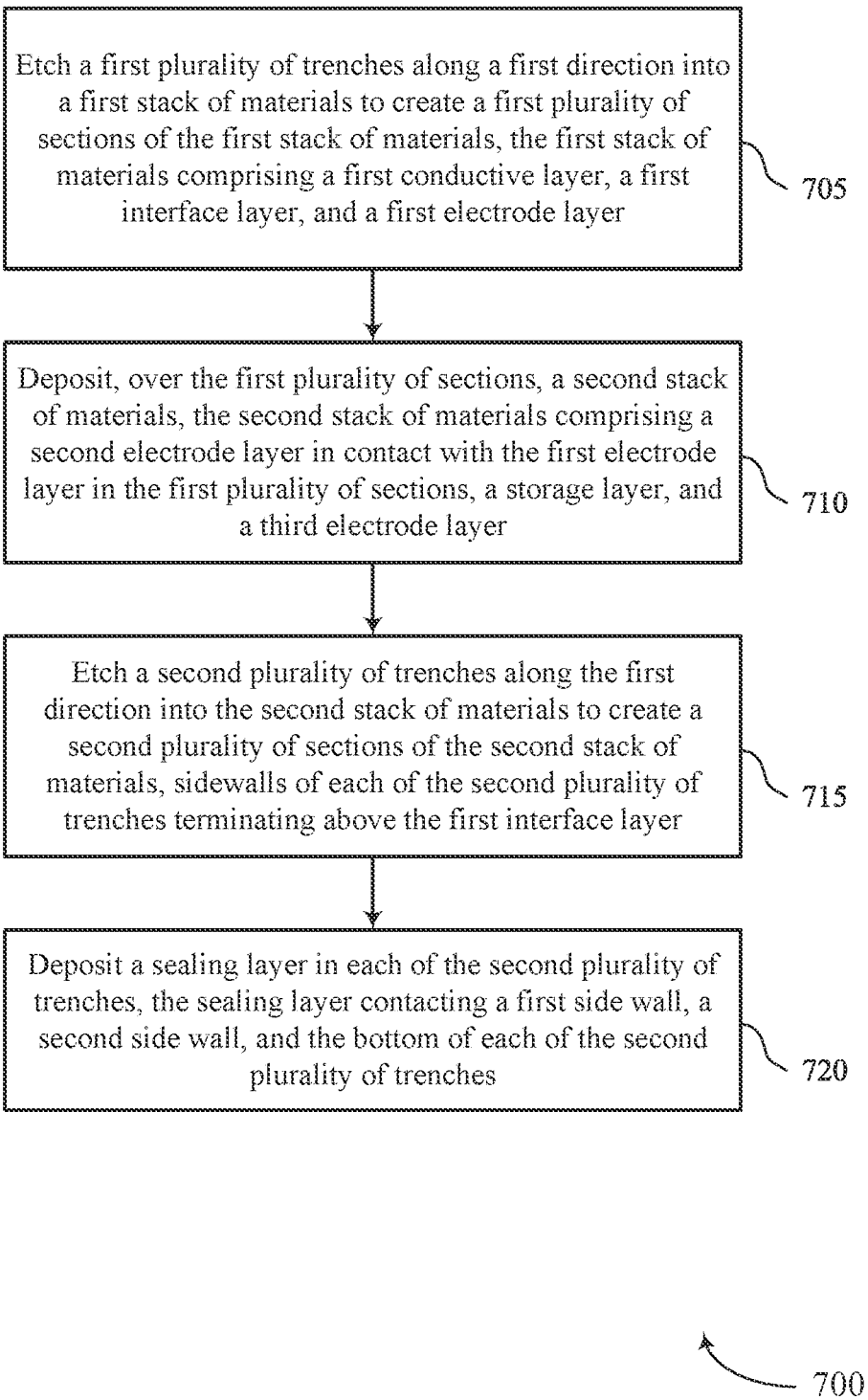
FIG. 7 shows a flowchart illustrating a method or methods that support techniques for manufacturing a double electrode memory array in accordance with examples as disclosed herein.

FIG. 7 shows a flowchart illustrating a method 700 that supports techniques for manufacturing a double electrode memory array in accordance with examples as disclosed herein. The operations of method 700 may be implemented by a process controller or its components as described herein. For example, the operations of method 700 may be performed by a process controller as described with reference to FIGS. 1 through 6. In some examples, a process controller may execute a set of instructions to control the functional elements of the device to perform the described functions. Additionally or alternatively, the process controller may perform aspects of the described functions using special-purpose hardware.

At 705, the method may include etching a first plurality of trenches along a first direction into a first stack of materials to create a first plurality of sections of the first stack of materials, the first stack of materials including a first conductive layer, a first interface layer, and a first electrode layer. The operations of 705 may be performed in accordance with examples as disclosed herein. In some examples, aspects of the operations of 705 may be performed by an interface etching manager 625 as described with reference to FIG. 6.

At 710, the method may include depositing, over the first plurality of sections, a second stack of materials, the second stack of materials including a second electrode layer in contact with the first electrode layer in the first plurality of sections, a storage layer, and a third electrode layer. The operations of 710 may be performed in accordance with examples as disclosed herein. In some examples, aspects of the operations of 710 may be performed by a depositing component 630 as described with reference to FIG. 6.

At 715, the method may include etching a second plurality of trenches along the first direction into the second stack of materials to create a second plurality of sections of the second stack of materials, sidewalls of each of the second plurality of trenches terminating above the first interface layer. The operations of 715 may be performed in accordance with examples as disclosed herein. In some examples, aspects of the operations of 715 may be performed by an etching manager 635 as described with reference to FIG. 6.

At 720, the method may include depositing a sealing layer in each of the second plurality of trenches, the sealing layer contacting a first side wall, a second side wall, and the bottom of each of the second plurality of trenches. The operations of 720 may be performed in accordance with examples as disclosed herein. In some examples, aspects of the operations of 720 may be performed by a seal component 640 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for etching a first plurality of trenches along a first direction into a first stack of materials to create a first plurality of sections of the first stack of materials, the first stack of materials including a first conductive layer, a first interface layer, and a first electrode layer; depositing, over the first plurality of sections, a second stack of materials, the second stack of materials including a second electrode layer in contact with the first electrode layer in the first plurality of sections, a storage layer, and a third electrode layer; etching a second plurality of trenches along the first direction into the second stack of materials to create a second plurality of sections of the second stack of materials, sidewalls of each of the second plurality of trenches terminating above the first interface layer; and depositing a sealing layer in each of the second plurality of trenches, the sealing layer contacting a first side wall, a second side wall, and the bottom of each of the second plurality of trenches.

Aspect 2: The apparatus of aspect 1, further including operations, features, circuitry, logic, means, or instructions, or any combination thereof for depositing the first stack of materials, where etching the first plurality of trenches is based at least in part on depositing the first stack of materials.

Aspect 3: The apparatus of aspect 2, further including operations, features, circuitry, logic, means, or instructions, or any combination thereof for depositing a third stack of materials, the third stack of materials including a fourth electrode layer, a second storage layer, a fifth electrode layer, and a second interface layer, where depositing the first stack of materials is based at least in part on depositing the third stack of materials.

Aspect 4: The apparatus of any of aspects 2 through 3, further including operations, features, circuitry, logic, means, or instructions, or any combination thereof for depositing, on the first stack of materials, a second sealing layer and a first dielectric layer, the first dielectric layer filling the first plurality of trenches.

Aspect 5: The apparatus of aspect 4, further including operations, features, circuitry, logic, means, or instructions, or any combination thereof for a dielectric constant of the sealing layer is greater than a dielectric constant of the first dielectric layer.

Aspect 6: The apparatus of any of aspects 4 through 5, further including operations, features, circuitry, logic, means, or instructions, or any combination thereof for a thickness of the second sealing layer is different than a thickness of the first sealing layer.

Aspect 7: The apparatus of any of aspects 1 through 6, further including operations, features, circuitry, logic, means, or instructions, or any combination thereof for planarizing the first stack of materials, where the planarizing includes removing at least a portion of the first electrode layer.

Aspect 8: The apparatus of any of aspects 1 through 7, further including operations, features, circuitry, logic, means, or instructions, or any combination thereof for depositing, on the second plurality of sections, a second dielectric layer, the second dielectric layer in contact with the sealing layer and filling the second plurality of trenches.

Aspect 9: The apparatus of aspect 8, further including operations, features, circuitry, logic, means, or instructions, or any combination thereof for planarizing the second plurality of sections, where the planarizing includes planarizing at least a portion of the third electrode layer.

Aspect 10: The apparatus of any of aspects 1 through 9, further including operations, features, circuitry, logic, means, or instructions, or any combination thereof for the first interface layer includes tungsten silicon nitride.

Aspect 11: The apparatus of any of aspects 1 through 10, further including operations, features, circuitry, logic, means, or instructions, or any combination thereof for the first conductive layer includes tungsten.

Aspect 12: The apparatus of any of aspects 1 through 11, further including operations, features, circuitry, logic, means, or instructions, or any combination thereof for the storage layer includes a chalcogenide material.

It should be noted that the methods described herein describe possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 13: A memory device, including: a first stack of materials including a first conductive layer, a first interface layer, and a first electrode layer; a first plurality of trenches dividing the first stack of materials into a first plurality of sections; a second stack of materials positioned above the first stack of materials, the second stack of materials including a second electrode layer in contact with the first electrode layer in the first plurality of sections, a storage layer, and a third electrode layer; a second plurality of trenches dividing the second stack of materials into a second plurality of sections, where sidewalls of each of the second plurality of trenches terminating above the first interface layer; and a sealing layer in each of the second plurality of trenches, the sealing layer contacting a first side wall, a second side wall, and the bottom of each of the second plurality of trenches.

Aspect 14: The memory device of aspect 13, further including: a first dielectric layer, the first dielectric layer filling the first plurality of trenches.

Aspect 15: The memory device of aspect 14, where a dielectric constant of the sealing layer is greater than a dielectric constant of the first dielectric layer.

Aspect 16: The memory device of any of aspects 13 through 15, further including: a second dielectric layer, the second dielectric layer in contact with the sealing layer and filling the second plurality of trenches.

Aspect 17: The memory device of any of aspects 13 through 16, further including: a third stack of materials positioned below the first stack of materials, the third stack of materials including a fourth electrode layer, a second storage layer, a fifth electrode layer, and a second interface layer.

Aspect 18: The memory device of any of aspects 13 through 17, where the first interface layer includes tungsten silicon nitride.

Aspect 19: The memory device of any of aspects 13 through 18, where the first conductive layer includes tungsten.

Aspect 20: The memory device of any of aspects 13 through 19, where the storage layer includes a chalcogenide material.

An apparatus is described. The following provides an overview of aspects of the apparatus as described herein:

Aspect 21: An apparatus, including: a plurality of memory cells formed by a process including: etching a first plurality of trenches along a first direction into a first stack of materials to create a first plurality of sections of the first stack of materials, the first stack of materials including a first conductive layer, a first interface layer, and a first electrode layer; depositing, over the first plurality of sections, a second stack of materials, the second stack of materials including a second electrode layer, a storage layer, and a third electrode layer, where the second electrode layer is in contact with the first electrode layer in the first plurality of sections; etching a second plurality of trenches along the first direction into the second stack of materials to create a second plurality of sections of the second stack of materials, where sidewalls of each of the second plurality of trenches terminate above the first interface layer; and depositing a sealing layer in each of the second plurality of trenches, where the sealing layer contacts a first side wall, a second side wall, and the bottom of each of the second plurality of trenches.

Aspect 22: The apparatus of aspect 21, the process further including: depositing the first stack of materials, where etching the first plurality of trenches is based at least in part on depositing the first stack of materials.

Aspect 23: The apparatus of any of aspects 21 through 22, the process further including: depositing, on the first stack of materials, a first dielectric layer, the first dielectric layer filling the first plurality of trenches.

Aspect 24: The apparatus of any of aspects 21 through 23, the process further including: planarizing the first stack of materials, where the planarizing includes removing at least a portion of the first electrode layer.

Aspect 25: The apparatus of any of aspects 21 through 24, the process further including: depositing, on the second plurality of sections, a second dielectric layer, the second dielectric layer in contact with the sealing layer and filling the second plurality of trenches.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
    etching a first plurality of trenches along a first direction into a first stack of materials to create a first plurality of sections of the first stack of materials, the first stack of materials comprising a first conductive layer, a first interface layer, and a first electrode layer:
    depositing, over the first plurality of sections, a second stack of materials, the second stack of materials comprising a second electrode layer in contact with the first electrode layer in the first plurality of sections, a storage layer, and a third electrode layer;
    etching a second plurality of trenches along the first direction into the second stack of materials to create a second plurality of sections of the second stack of materials, sidewalls of each of the second plurality of trenches terminating above the first interface layer; and
    depositing a sealing layer in each of the second plurality of trenches, the sealing layer contacting a first side wall, a second side wall, and the bottom of each of the second plurality of trenches.

2. The method of claim 1, further comprising:
    depositing the first stack of materials, wherein etching the first plurality of trenches is based at least in part on depositing the first stack of materials.

3. The method of claim 2, further comprising:
    depositing a third stack of materials, the third stack of materials comprising a fourth electrode layer, a second storage layer, a fifth electrode layer, and a second interface layer, wherein depositing the first stack of materials is based at least in part on depositing the third stack of materials.

4. The method of claim 2, further comprising:
    depositing, on the first stack of materials, a second sealing layer and a first dielectric layer, the first dielectric layer filling the first plurality of trenches.

5. The method of claim 4, wherein a dielectric constant of the sealing layer is greater than a dielectric constant of the first dielectric layer.

6. The method of claim 4, wherein a thickness of the second sealing layer is different than a thickness of the sealing layer.

7. The method of claim 1, further comprising:
    planarizing the first stack of materials, wherein the planarizing comprises removing at least a portion of the first electrode layer.

8. The method of claim 1, further comprising:
    depositing, on the second plurality of sections, a second dielectric layer, the second dielectric layer in contact with the sealing layer and filling the second plurality of trenches.

9. The method of claim 8, further comprising:
    planarizing the second plurality of sections, wherein the planarizing comprises planarizing at least a portion of the third electrode layer.

10. The method of claim 1, wherein the first interface layer comprises tungsten silicon nitride.

11. The method of claim 1, wherein the first conductive layer comprises tungsten.

12. The method of claim 1, wherein the storage layer comprises a chalcogenide material.

13. A memory device, comprising:
    a first stack of materials comprising a first conductive layer, a first interface layer, and a first electrode layer;
    a first plurality of trenches dividing the first stack of materials into a first plurality of sections;
    a second stack of materials positioned above the first stack of materials, the second stack of materials comprising a second electrode layer in contact with the first electrode layer in the first plurality of sections, a storage layer, and a third electrode layer;
    a second plurality of trenches dividing the second stack of materials into a second plurality of sections, wherein sidewalls of each of the second plurality of trenches terminating above the first interface layer; and
    a sealing layer in each of the second plurality of trenches, the sealing layer contacting a first side wall, a second side wall, and the bottom of each of the second plurality of trenches.

14. The memory device of claim 13, further comprising:
    a first dielectric layer, the first dielectric layer filling the first plurality of trenches.

15. The memory device of claim 14, wherein a dielectric constant of the sealing layer is greater than a dielectric constant of the first dielectric layer.

16. The memory device of claim 13, further comprising:
    a second dielectric layer, the second dielectric layer in contact with the sealing layer and filling the second plurality of trenches.

17. The memory device of claim 13, further comprising:
    a third stack of materials positioned below the first stack of materials, the third stack of materials comprising a fourth electrode layer, a second storage layer, a fifth electrode layer, and a second interface layer.

18. The memory device of claim 13, wherein the first interface layer comprises tungsten silicon nitride.

19. The memory device of claim 13, wherein the first conductive layer comprises tungsten.

20. The memory device of claim 13, wherein the storage layer comprises a chalcogenide material.

21. An apparatus, comprising:
    a plurality of memory cells formed by a process comprising:

etching a first plurality of trenches along a first direction into a first stack of materials to create a first plurality of sections of the first stack of materials, the first stack of materials comprising a first conductive layer, a first interface layer, and a first electrode layer;

depositing, over the first plurality of sections, a second stack of materials, the second stack of materials comprising a second electrode layer, a storage layer, and a third electrode layer, wherein the second electrode layer is in contact with the first electrode layer in the first plurality of sections;

etching a second plurality of trenches along the first direction into the second stack of materials to create a second plurality of sections of the second stack of materials, wherein sidewalk of each of the second plurality of trenches terminate above the first interface layer; and depositing a sealing layer in each of the second plurality of trenches, wherein the sealing layer contacts a first side wall, a second side wall, and the bottom of each of the second plurality of trenches.

22. The apparatus of claim 21, the process further comprising:
   depositing the first stack of materials, wherein etching the first plurality of trenches is based at least in part on depositing the first stack of materials.

23. The apparatus of claim 21, the process further comprising:
   depositing, on the first stack of materials, a first dielectric layer, the first dielectric layer filling the first plurality of trenches.

24. The apparatus of claim 21, the process further comprising:
   planarizing the first stack of materials, wherein the planarizing comprises removing at least a portion of the first electrode layer.

25. The apparatus of claim 21, the process further comprising:
   depositing, on the second plurality of sections, a second dielectric layer, the second dielectric layer in contact with the sealing layer and filling the second plurality of trenches.

* * * * *